United States Patent [19]
Lee et al.

[11] Patent Number: 5,711,815
[45] Date of Patent: Jan. 27, 1998

[54] FILM FORMING APPARATUS AND FILM FORMING METHOD

[75] Inventors: Hideki Lee, Nirasaki; Tomihiro Yonenaga, Yamanashi-ken, both of Japan

[73] Assignee: Tokyo Electron Limited, Tokyo, Japan

[21] Appl. No.: 669,802

[22] Filed: Jun. 27, 1996

Related U.S. Application Data

[63] Continuation of Ser. No. 292,256, Aug. 18, 1994, abandoned.

[30] Foreign Application Priority Data

Aug. 18, 1993 [JP] Japan .................................. 5-225211
Aug. 18, 1993 [JP] Japan .................................. 5-225213

[51] Int. Cl.$^6$ .................................................. C23C 16/00
[52] U.S. Cl. ............................ 118/725; 118/715; 118/728
[58] Field of Search ................................ 118/715, 725, 118/728

[56] References Cited

U.S. PATENT DOCUMENTS

| | | | |
|---|---|---|---|
| 5,000,113 | 3/1991 | Wang | 118/723 E |
| 5,447,570 | 9/1995 | Schmitz | 118/728 |
| 5,534,072 | 7/1996 | Mizuno | 118/728 |

FOREIGN PATENT DOCUMENTS

| | | |
|---|---|---|
| 61-208213 | 9/1986 | Japan . |
| 3-181128 | 8/1991 | Japan . |

*Primary Examiner*—Richard Bueker
*Attorney, Agent, or Firm*—Oblon, Spivak, McClelland, Maier & Neustadt, P.C.

[57] ABSTRACT

A film forming apparatus includes: a chamber for housing a semiconductor wafer having a surface on which a film is to be formed, and performing a film formation process with respect to the semiconductor wafer; a process gas supply system for supplying a process gas for forming the film onto the surface of the semiconductor wafer on which the film is to be formed; a heater for heating the semiconductor wafer to decompose a film forming gas, thereby forming the film on the wafer; a purge gas supply system for supplying a purge gas from a lower surface side of the surface of the semiconductor wafer on which the film is to be formed toward a peripheral edge portion of the semiconductor wafer; and a ring member positioned at a position to cover a peripheral edge portion of the surface on which the film is to be formed when film formation is to be performed with respect to the semiconductor wafer, the ring member having an outer edge projecting from an outer edge of the target object in the film formation. A flow path in which substantially all the purge gas flows outward from the target object is formed by the ring member.

10 Claims, 12 Drawing Sheets

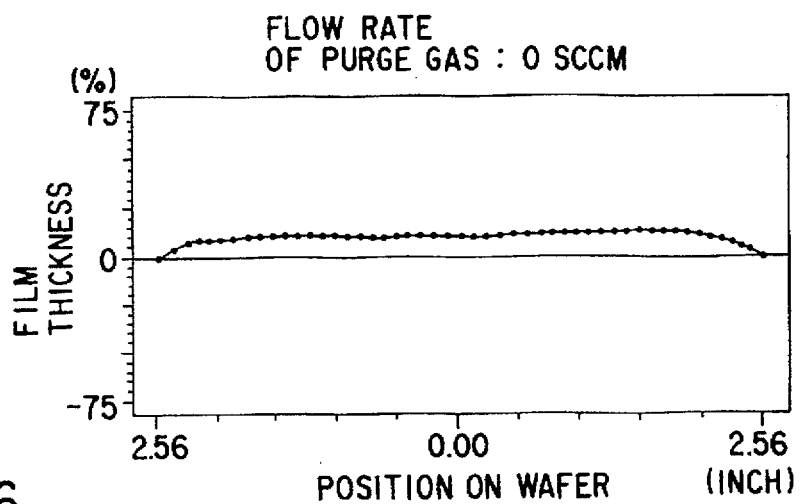
F I G. 6
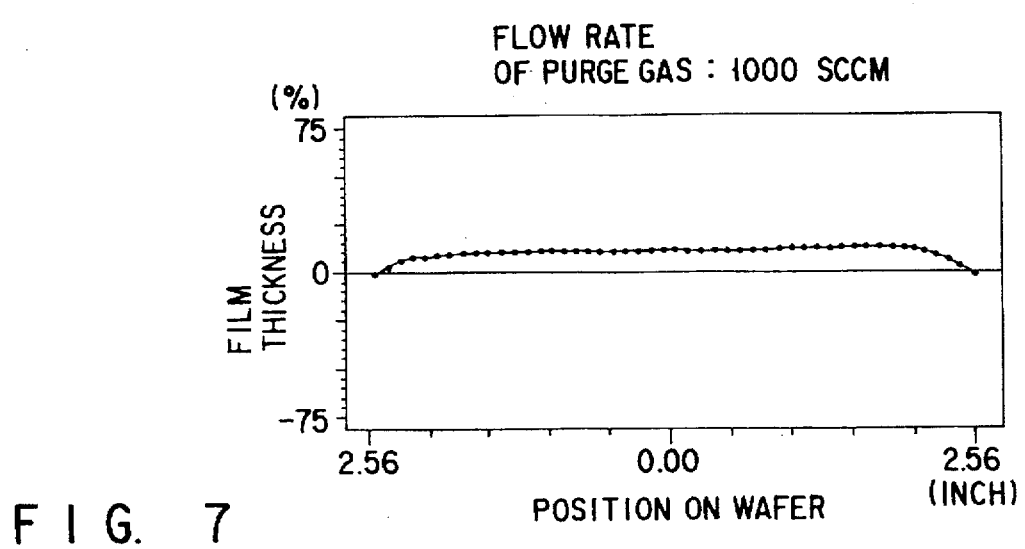
F I G. 7
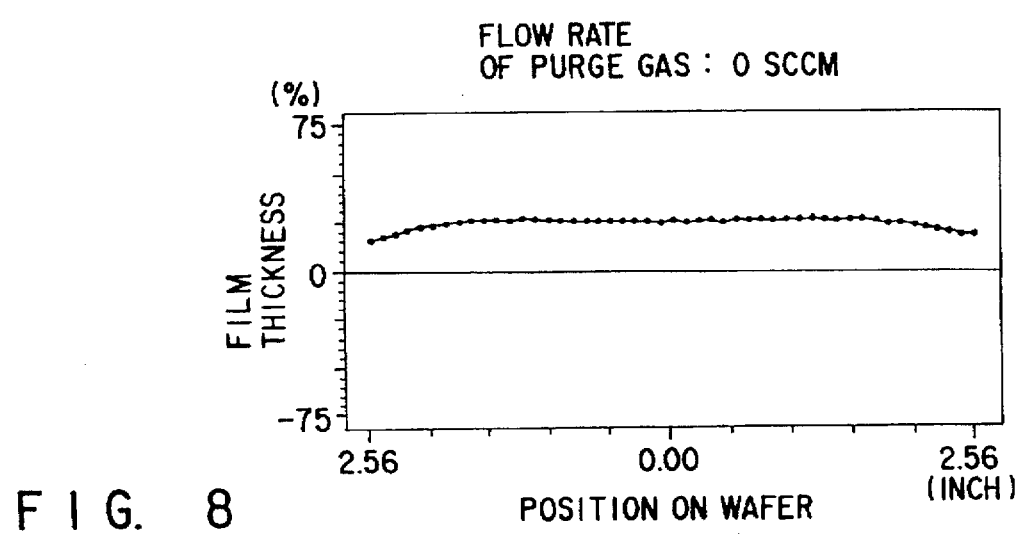
F I G. 8

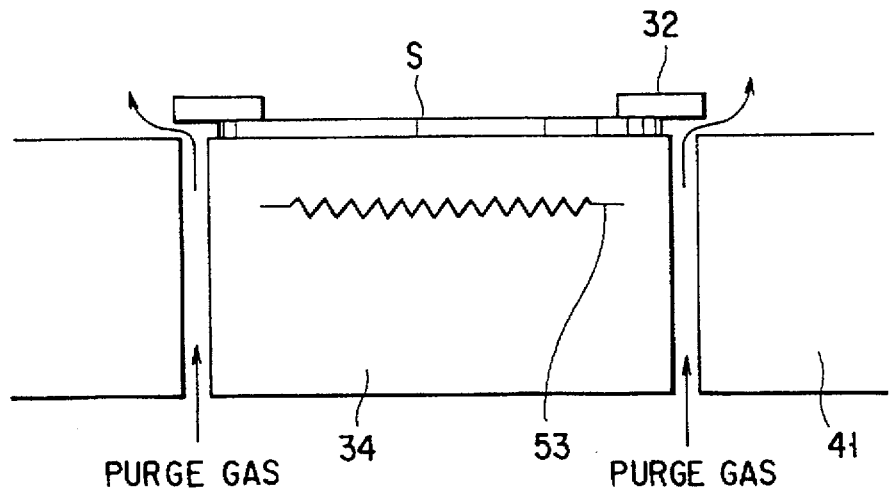
F I G. 12
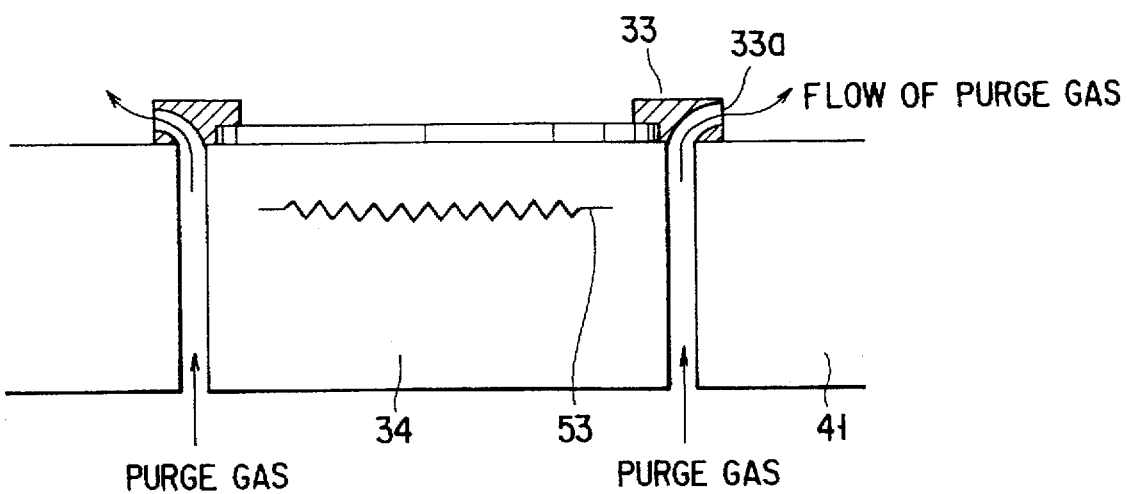
F I G. 13

FILM FORMING APPARATUS AND FILM FORMING METHOD

This application is a Continuation of application Ser. No. 08/292,256, filed on Aug. 18, 1994, now abandoned.

BACKGROUND OF THE INVENTION

1. Field of the Invention

The present invention relates to a film forming apparatus for forming a desired film on a target object such as a semiconductor wafer by CVD (Chemical Vapor Deposition) and a film forming method thereof.

2. Description of the Related Art

In a process of manufacturing a semiconductor, a thin film is formed using a CVD (Chemical Vapor Deposition) apparatus in order to form an integrated circuit on the surface of a semiconductor wafer such as silicon.

In such a step of forming a thin film, film formation must often be avoided at the peripheral edge portion and the lower surface of a semiconductor wafer. For example, since $SiO_2$ is formed on the peripheral edge portion and the lower surface of the wafer, when a CVD process is performed on the surface of a wafer using a film forming gas such as a $WF_6$ gas in order to bury tungsten (W) in a micropatterned contact hole, a W film should not be produced on the $SiO_2$ film. This is because the W film has poor adhesion properties with respect to $SiO_2$ and tends to peel off from $SiO_2$. If the W film is attached to the $SiO_2$ film, the W film is peeled to scatter as particles, undesirably contaminating the wafer.

Conventionally, for example, when a W film is to be formed on the surface of a semiconductor wafer by a thermal CVD process, a gas flow path 11 is formed around a wafer table 1 arranged at the center of a process chamber so as to blow a purge gas, e.g., an $N_2$ gas upward as shown in FIG. 1. On the other hand, a ring-shaped guide 12 having an L-shaped section surrounds the peripheral edge portion of a semiconductor wafer S such that the purge gas blown from the gas flow path 11 goes upward from the peripheral edge portion of the wafer S toward the inner side thereof.

As another example, as shown in FIG. 2, a ring-shaped press member 13 tightly contacting the wafer peripheral portion and the surface of a wafer table 1 is provided. In addition, a gas flow path 14 is formed around the wafer table 1 so as to blow a purge gas toward the bottom surface of the press member 13.

When film formation is to be performed on a semiconductor wafer using such a thermal CVD apparatus, the wafer is heated by a heater 10 incorporated in the wafer table 1. A film forming gas, e.g., a $WF_6$ gas is fed from the upper portion of the process chamber toward the wafer, and exhausted at, e.g., the side portion of the process chamber, thereby forming a W film on the surface of the wafer.

In the apparatus of FIG. 1, since the purge gas flows from the peripheral edge portion of the wafer toward the upper portion at the inner side thereof as represented by arrows, the film forming gas is prevented from going around the peripheral edge portion of the wafer. As a result, the W film is prevented from attaching to the peripheral edge portion and the lower surface of the wafer.

In the apparatus of FIG. 2, the peripheral edge portion of the wafer is masked by the press member 13, and a part of the purge gas blown to the lower surface of the press member 13 flows from the peripheral edge portion of the wafer toward the inner side thereof through a gap between the press member 13 and the wafer table 1 or the wafer as represented by arrows. For this reason, the film forming gas is prevented from going around the peripheral edge portion of the wafer.

In the methods shown in FIGS. 1 and 2, however, since the purge gas flows from the peripheral edge portion of the wafer toward the central portion thereof, the flow speed of the film forming gas on the surface of the wafer at a portion near the peripheral edge portion of the wafer is different from that at the central portion thereof, causing a degradation in uniformity in film thickness. In addition, when particles are produced at the lower surface side of the wafer, the particles are carried to the surface of the wafer by the purge gas and tend to attach thereto.

On the other hand, a semiconductor device has been highly integrated and micropatterned as represented by a DRAM, and various improvements and examinations for device structures and processes are required. Of these requirements, a wiring technique is particularly required because a conventional sputter film is very difficult to bury a micropatterned contact hole and a micropatterned through hole each having a size of about 0.5 μm. As a suitable technique of forming a micropatterned wiring layer, a technique (W-CVD method) of burying W in a hole by the CVD method has been examined and used in practice.

Of the W-CVD methods, a burying method called a blanket W-CVD method is effective because it has advantages in a high resistance to migration wiring and a high resistance to thermal stress. According to this method, an oxide film is pattern-etched to form a hole such as a contact hole or a through hole in a wafer. A W film is formed on this wafer so as to bury the hole using a process gas such as a $WF_6$ gas. Thereafter, the W film is etched (etched back) until the oxide film is exposed, and W remains in the hole to form a wiring layer.

In this case, conventionally, a semiconductor wafer is mounted on a table provided in a process chamber as a vacuum vessel and incorporating a heater. The semiconductor wafer is heated by the heater to a predetermined temperature for film formation, and a process gas, e.g., a $WF_6$ gas is supplied onto the surface of the wafer, while the process chamber is evacuated to keep a predetermined vaccum degree. W produced by thermally decomposing the $WF_6$ gas is deposited on the surface of the wafer to form a W film.

If this temperature for film formation is too high, burying characteristics become poor to form voids. On the other hand, if this temperature is too low, a morphology (a state on the surface of the W film) becomes degraded to make the surface of the W film rough. When the W film is etched back, this state on the surface is transferred to the surface of a portion in which W is buried to cause a disadvantage in subsequent formation of an optimal image by a stepper. Therefore, the heating amount of the heater must be controlled such that the surface of the wafer is kept at a temperature which satisfies both the burying characteristics and the morphology.

In this case, the optimal temperature of the morphology is different from that of the burying characteristics. For this reason, when the temperature for film formation is set within a temperature region wherein voids are not formed in burying, the roughness of the surface of the W film is not so decreased. In recent years, as has been described above, since the line width of a pattern is greatly reduced, an optimal image having a high precision may not be obtained in a lithographic step by a stepper using the roughness of the surface at a conventional level.

SUMMARY OF THE INVENTION

It is an object of the present invention to provide a film forming apparatus employing CVD by which film formation with respect to the lower surface and the peripheral edge portion of the surface to be processed of a target object can be effectively avoided without degrading uniformity in film thickness, and a film forming method thereof.

It is another object of the present invention to provide a film forming method of performing film formation with respect to the surface of a target object having a hole wherein both burying characteristics in the hole and roughness of the surface are good.

According to the first aspect of the present invention, there is provided a film forming apparatus comprising:

- a chamber for housing a target object having a surface on which a film is to be formed, and performing a film formation process with respect to the target object;
- process gas supply means for supplying a process gas for forming the film onto the surface of the target object on which the film is to be formed;
- film forming means for performing film formation using the film forming gas with respect to the surface of the target object on which the film is to be formed;
- purge gas supply means for supplying a purge gas from a side opposite to the surface of the target object on which the film is to be formed toward a peripheral edge portion of the target object; and
- a ring member positioned at a position to cover a peripheral edge portion of the surface on which the film is to be formed when film formation is to be performed with respect to the target object, the ring member having an outer edge projecting from an outer edge of the target object in the film formation,
- wherein a flow path in which substantially all the purge gas flows outward from the target object is formed by the ring member.

According to the second aspect of the present invention, there is provided a film forming method comprising the steps of:

- housing, in a chamber, a target object having a surface on which a film is to be formed;
- arranging a ring-shaped member such that the ring-shaped member contacts a peripheral edge portion of the surface of the target object on which the film is to be formed, and an outer edge of the ring-shaped member projects outside an outer edge of the target object;
- supplying a process gas for forming the film onto the surface of the target object on which the film is to be formed; and
- supplying a purge gas from a side opposite to the surface of the target object on which the film is to be formed toward a peripheral edge portion of the target object;
- wherein a flow path in which substantially all the purge gas flows outward from the target object is formed by the ring member.

According to the third aspect of the present invention, there is provided a film forming apparatus comprising:

- a chamber for housing a target object having a surface on which a film is to be formed, and performing a film formation process with respect to the target object;
- process gas supply means for supplying a process gas for forming the film onto the surface of the target object on which the film is to be formed;
- film forming means for performing film formation using the film forming gas with respect to the surface of the target object on which the film is to be formed;
- purge gas supply means for supplying a purge gas from a side opposite to the surface of the target object on which the film is to be formed toward a peripheral edge portion of the target object; and
- a ring member positioned at a position to cover a peripheral edge portion of the surface on which the film is to be formed when film formation is to be performed with respect to the target object, the ring member having an outer edge projecting from an outer edge of the target object in the film formation,
- wherein a flow path in which substantially all the purge gas flows outward from the target object is formed by the ring member, and a gap having a width defined such that the purge gas does not substantially flow and a film formed on the ring member is not continuous with the film formed on the target object is formed between the ring member and the target object.

According to the fourth aspect of the present invention, there is provided a film forming method in which a target object having a surface having a hole therein is placed in a chamber, and a process gas is supplied onto the surface to perform film formation on the surface having the hole therein by chemical vapor reaction, comprising:

- the first step of heating the target object to a first temperature to perform film formation on the surface of the target object; and
- the second step of heating the target object to a second temperature higher than the first temperature after the first step to further continue film formation.

BRIEF DESCRIPTION OF THE DRAWINGS

FIGS. 6 and 7 are graphs each showing a distribution of a thickness of a W film formed on a semiconductor wafer by the apparatus according to an experimental example;

FIGS. 8 to 11 are graphs each showing a distribution of a thickness of a W film formed on a semiconductor wafer by the apparatus according to a comparative example;

FIGS. 12 and 13 are partial sectional views each showing a modification of the film forming apparatus according to this embodiment;

DETAILED DESCRIPTION OF THE PREFERRED EMBODIMENTS

The preferred embodiments of the present invention will be described in detail with reference to the accompanying drawings.

Figure 1:
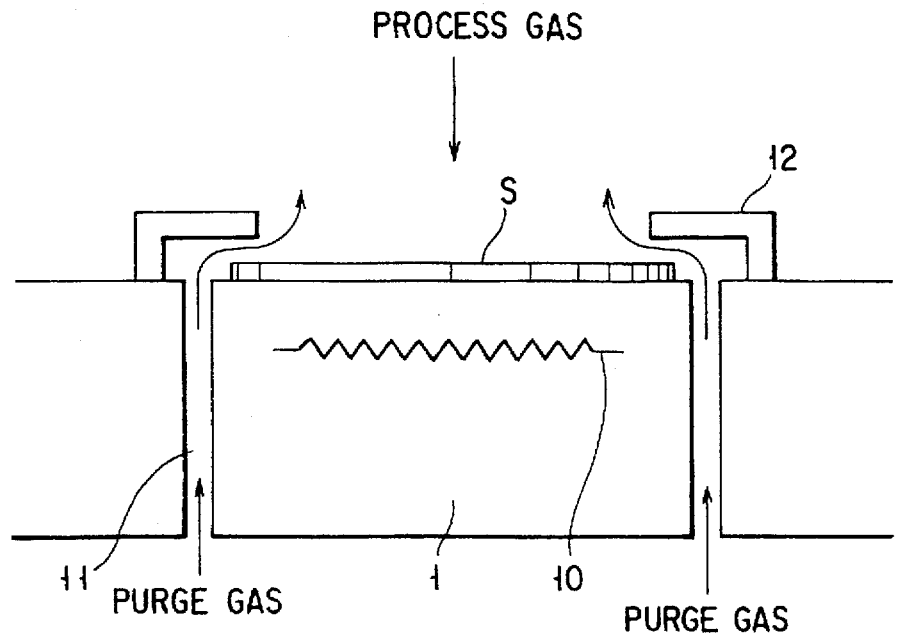
FIGS. 1 and 2 are sectional views each showing the main part of a conventional film forming apparatus.
Figure 2:
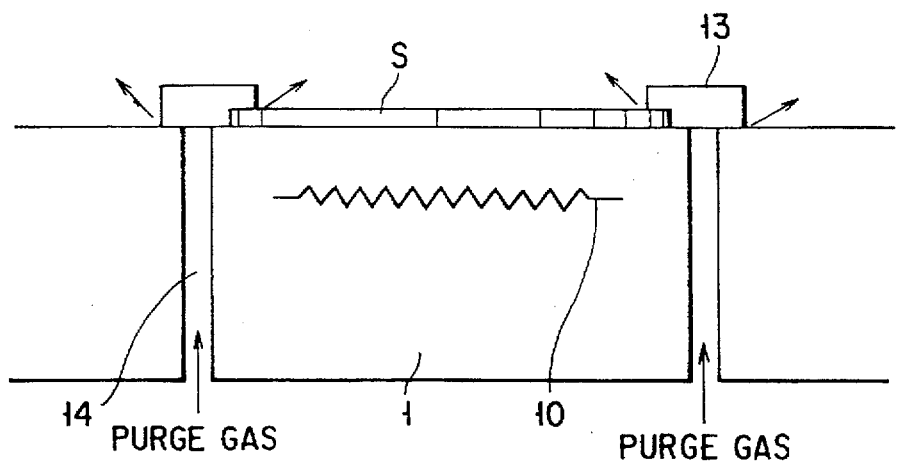
Figure 3:
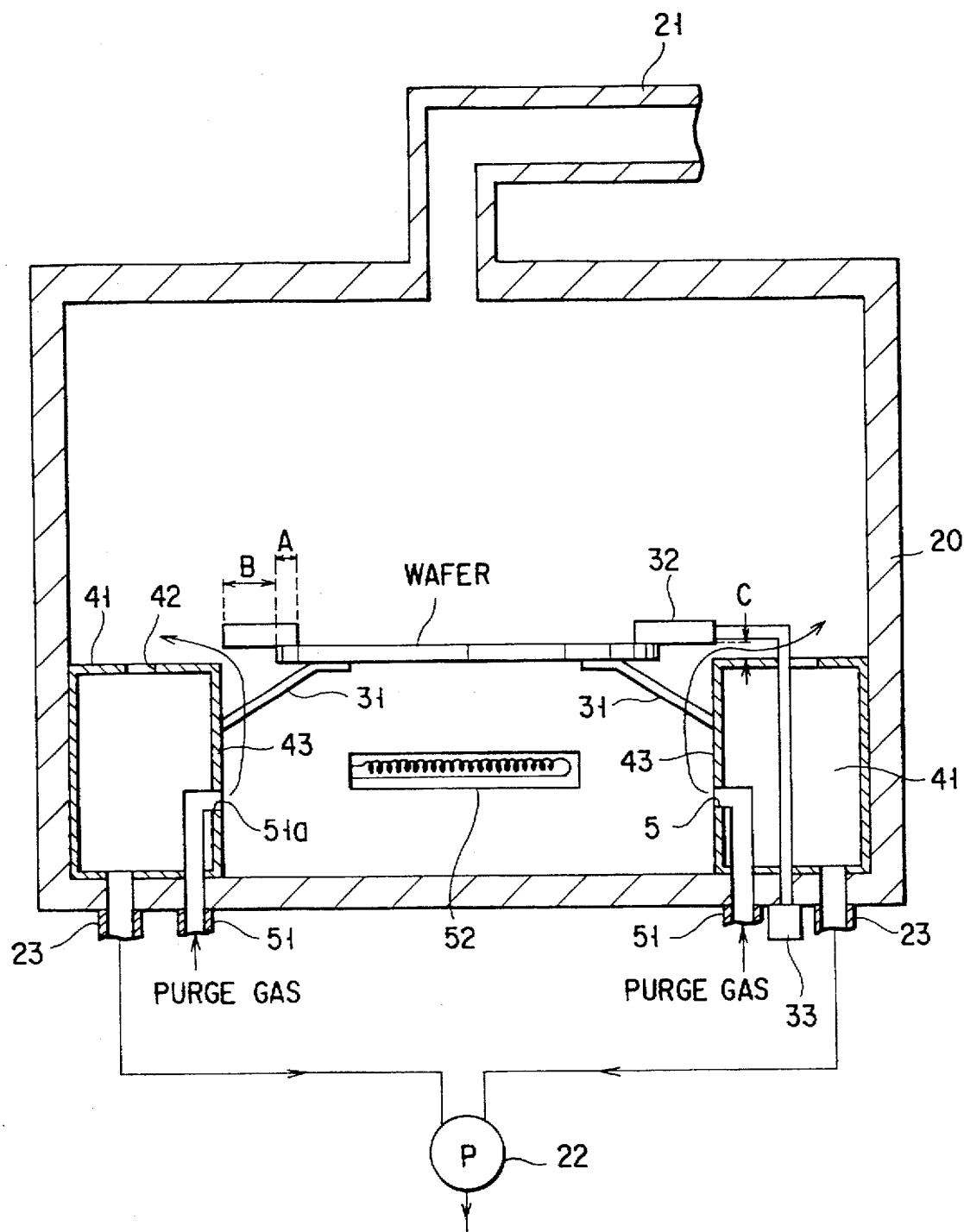
FIG. 3 is a sectional view showing a thermal CVD film forming apparatus according to an embodiment of the present invention.

FIG. 3 is a sectional view showing a thermal CVD film forming apparatus according to an embodiment of the present invention. A process chamber 20 is for performing film formation with respect to a semiconductor wafer S as a target object therein, and is air-tightly sealed. A process gas supply pipe 21 for supplying a process gas containing, e.g., a $WF_6$ gas as a film forming gas, and an $N_2$ gas and an $H_2$ gas as carrier gases is coupled to the top portion of the process chamber 20.

A support frame 31 for supporting the semiconductor wafer S is provided to an outside wall surface 43 inside an exhaust chamber 41 (to be described later) under the process gas supply pipe 21 in the process chamber 20.

A ring member 32 for covering the peripheral edge portion of the surface (a surface on which a thin film is formed) of the semiconductor wafer S supported by the support frame 31 is provided to freely contact the surface of the semiconductor wafer S, e.g., to vertically move between a position to cover the surface of the wafer and a position above it. The vertical movement of the ring member 32 is achieved by a drive mechanism 33 comprising a cylinder and the like. When the ring member 32 covers the peripheral edge portion of the surface of the semiconductor wafer, the outer edge portion of the ring member 32 projects outward such that an overlapping portion A with the wafer, and a projection B are respectively set at, e.g., about 1 to 3 mm and about 10 to 20 mm, as shown in FIG. 3

The annular exhaust chamber 41 for exhausting a process gas is formed along the inner wall of the process chamber 20 around the wafer supported by the support frame 31 at a predetermined interval with the peripheral portion of the wafer. The upper surface of the exhaust chamber 41 is set so as to form an interval o of, e.g., about 1 mm with the lower surface of the ring member 32 on the wafer in the direction of height. In this embodiment, the gap between the ring member 32 and the exhaust chamber 41 forms a flow path of a purge gas (to be described later).

Exhaust ports 42 are formed in the upper wall of the exhaust chamber 41, and exhaust pipes 23 connected to a vacuum pump 22 are coupled to the bottom portion of the exhaust chamber 41.

Purge gas supply pipes 51 as purge gas supply portions for supplying a purge gas consisting of, e.g., an $N_2$ gas to the projection (the outer edge portion projecting outside the wafer) of the ring member 32 are provided to the lower surface side of the wafer in the process chamber 20. Each purge gas supply pipe 51 has an opening 51a, which communicates with the interior of the exhaust chamber 41, in the inner outside wall surface 43 of the exhaust chamber 41. A heating lamp 52 for heating the semiconductor wafer S from its lower surface is arranged to oppose the wafer S.

Figure 4:
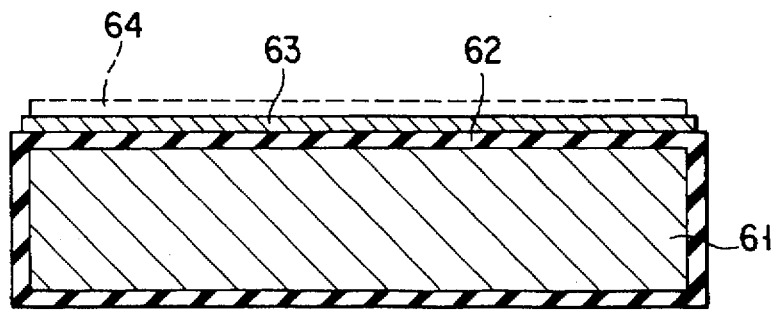
FIG. 4 is a sectional view showing an example of a semiconductor wafer as a target object.

In the film forming apparatus having the above arrangement, first, the semiconductor wafer S as a target object is mounted on the support frame 31 by a convey arm (not shown) through a loading/unloading port (not shown). The ring member 32 is arranged to press the peripheral edge portion of the surface of the wafer by the drive mechanism 33. As the semiconductor wafer S, for example as shown in FIG. 4, an $SiO_2$ film 62 is formed on the entire surface of a silicon substrate 61, and a TiN film 63 is formed on the surface of the resultant structure.

The heating lamp 52 is turned on to heat the wafer to, e.g., 450° C. The process gas consisting of, e.g., $WF_6$, $N_2$, and $H_2$ is supplied from the process gas supply pipe 21 to the process chamber 20 while the process chamber 20 is evacuated by the vacuum pump 22 through the exhaust ports 42 and the exhaust chamber 41 to keep the interior of the process chamber 20 at a predetermined pressure of, e.g., 50 Torr. At this time, the process gas is uniformly supplied onto the surface of the wafer. The $WF_6$ gas is decomposed by the heat of the wafer, and W (tungsten) is deposited on the surface of the wafer to form a W film 64.

On the other hand, the purge gas is supplied from the purge gas supply pipes 51 toward the lower surface side of the wafer to the ring member 32, and almost all the purge gas flows outward from the peripheral edge portion of the wafer through the flow path between the ring member 32 on the semiconductor wafer S and the exhaust chamber 41 as represented by arrows in FIG. 3. For this reason, the process gas is prevented from going around the peripheral edge portion and the lower surface of the wafer. As a result, the W film is prevented from being deposited on the peripheral edge portion and the lower surface of the semiconductor wafer S. In addition, since the purge gas flows outside the wafer S without interrupting the flow of the process gas flowing toward the wafer, uniform film formation can be performed with respect to the surface of the wafer S.

In order to confirm the effect obtained when film formation is performed on the basis of this embodiment, the following experiments were performed.

Figure 5A:
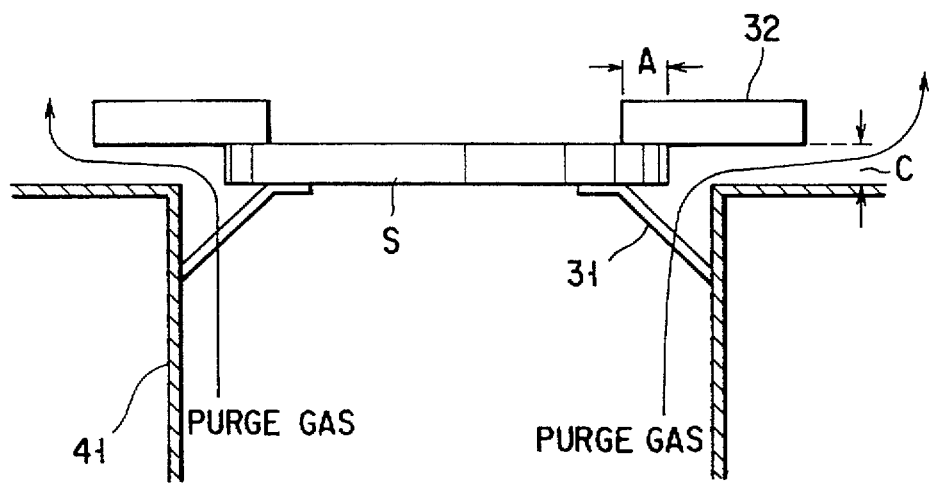
FIG. 5A is a sectional view showing a model apparatus for grasping an effect of this embodiment.

A model apparatus having the above arrangement was prepared. As shown in FIG. 5A, the overlapping portion A between the semiconductor wafer S and the ring member 32, and the interval C between the ring member 32 and the exhaust chamber 41 were respectively set at 2 mm and 1 mm to cause the purge gas to flow outward from the peripheral edge portion of the wafer. In this apparatus, film formation with respect to the wafer was performed while changing the flow rate of the purge gas. The sheet resistance of the formed thin film was measured, and a film thickness was calculated using the measurement value.

An experiment (Experimental Example) was performed under the following conditions. The flow rate of the film forming gas as the $WF_2$ gas was set at 50 SCCM; and those of the carrier gases as the $H_2$ and $N_2$ gases, 1,500 SCCM and 4,500 SCCM, respectively. The temperature of the surface of the wafer was set at 450×C.; the pressure in the process chamber, 50 Torr; and the flow rates of the purge gas, 0 SCCM and 1,000 SCCM. Note that the $N_2$ gas was used as the purge gas.

Figure 5B:
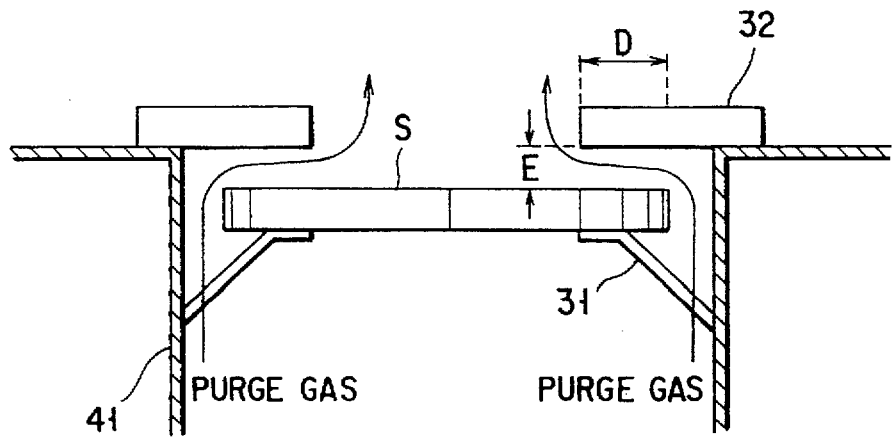
FIG. 5B is a sectional view showing a model apparatus used for comparison.
Figure 9:
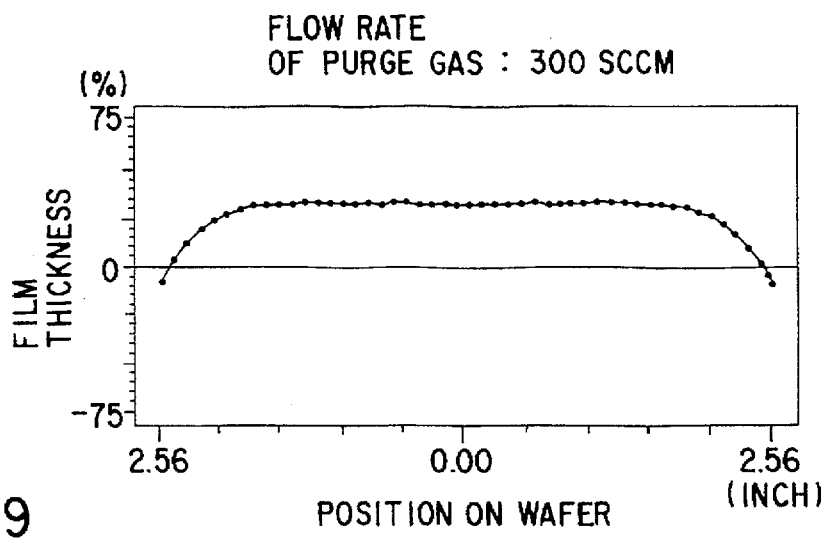
Figure 10:
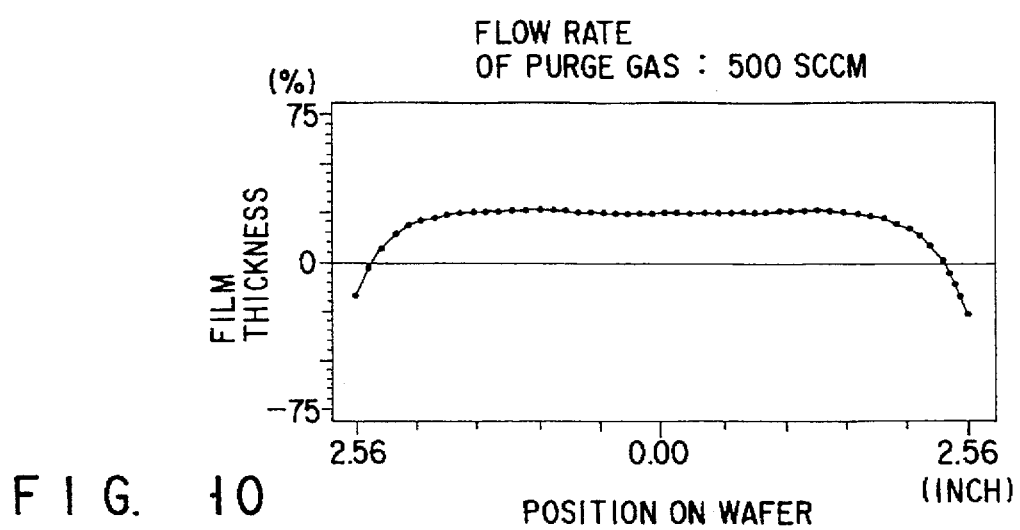
Figure 11:
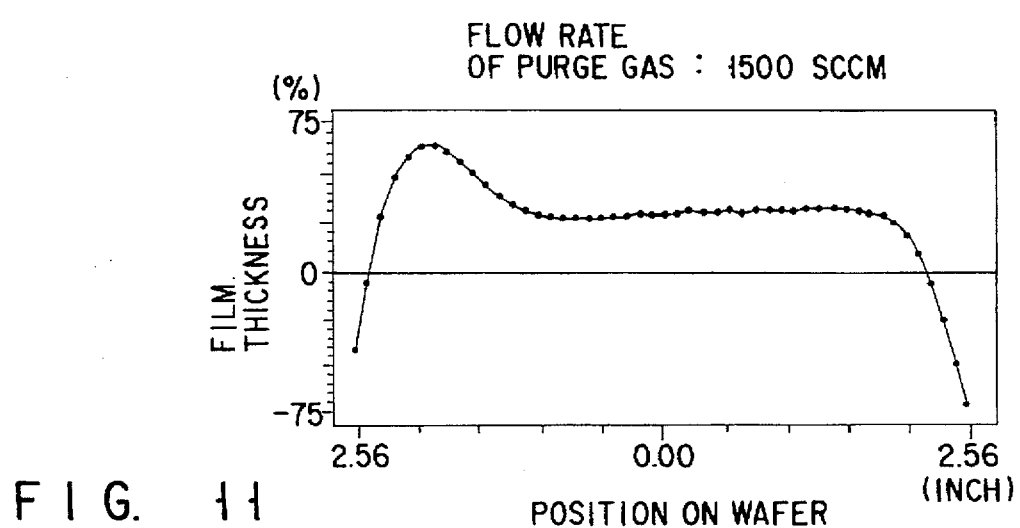

In order to perform a comparative experiment, as shown in FIG. 5B, the ring member 32 was arranged not on the surface of the semiconductor wafer S but on the exhaust chamber 41. The inner edge portion of the ring member 32 projected above the surface of the wafer S while an interval E was formed between the lower surface of the ring member 32 and the upper surface of the wafer S. An overlapping portion D between the wafer S and the ring member 32, and the interval E between the ring member 32 and the ring member 32 were respectively set at 4 mm and 1 mm to cause the purge gas to flow from the peripheral edge portion of the wafer to the inner side thereof. The apparatus having the above arrangement was used to perform an experiment as in Experimental Example.

The experiment (Comparative Example) was performed under the following conditions. The flow rate of the film forming gas as the $WF_6$ gas was set at 50 SCCM; and those of the carrier gases as the $H_2$ and $N_2$ gases, 1,500 SCCM and 3,000 SCCM, respectively. The flow rates of the purge gas were set at 0 SCCM, 300 SCCM, 500 SCCM and 1,500 SCCM. Other conditions were the same as in Experimental Example 1.

The respective experimental results of Example 1 are shown in Table 1 and FIGS. 6 and 7, and those of the Comparative Example are shown in Table 2 and FIGS. 8 to 11. Tables 1 and 2 show whether the W film is deposited on the lower surface of the wafer or not, and FIGS. 6 to 11 show the distributions of the thicknesses of the W films on the surfaces of the wafers. Each abscissa in FIGS. 6 to 11 represents a position on the wafer in inch, and each ordinate represents the film thickness in percentage (%) using the mean value as 0.

TABLE 1

Experimental Example

| Flow Rate of Purge GAS (SCCM) | Standard Deviation of Sheet Resistance (%) | Deposition of W Film on Lower Surface of Water |
| --- | --- | --- |
| 0 | 4.414 | Presence |
| 1,000 | 4.367 | Absence |

TABLE 2

Comparative Example

| Flow Rate of Purge GAS (SCCM) | Standard Deviation of Sheet Resistance (%) | Deposition of W Film on Lower Surface of Water |
| --- | --- | --- |
| 0 | 3.702 | Presence |
| 300 | 16.673 | Presence |
| 500 | 24.757 | Presence |
| 1,500 | 84.173 | Absence |

In Example as shown in Table 1, when the purge gas was supplied at a flow rate of 1,000 SCCM, no W film was deposited on the lower surface of the wafer. Depending on whether the purge gas was supplied or not, it was confirmed that there was almost no difference in standard deviations of the sheet resistances of the W films formed on the surfaces of the wafers. Since the sheet resistance is almost inversely proportional to the film thickness, no difference in standard deviation of the sheet resistance by change in flow rate of the purge gas means that uniformity in thickness of the W film formed on the surface of the wafer is not changed by a change in flow rate of the purge gas. This is also apparent from the distributions of the thicknesses of the W films shown in FIGS. 6 and 7.

On the other hand, in the Comparative Example as shown in Table 2, when the purge gas was supplied at a flow rate of 1,500 SCCM, no W film was deposited on the lower surface of the wafer. When the flow rate was at a lower value of 500 SCCM or 300 SCCM, the W film was deposited. As the flow rate of the purge gas increased, it was confirmed that the standard deviation of the sheet resistance of the W film formed on the surface of the wafer greatly increased. That is, as shown in FIGS. 8 to 11, uniformity in distribution of the thickness of the W film was extremely degraded in proportion to the flow rate of the purge gas.

As has been confirmed from the above experiments, in the film forming apparatus according to this embodiment, the purge gas supplied from the lower surface side of the wafer is flowed outward from the peripheral edge portion of the wafer by covering the peripheral edge portion of the wafer using the ring member. With this arrangement, the process gas is prevented from going around the peripheral edge portion of the wafer. As a result, the W film is prevented from being deposited on the peripheral edge portion and the lower surface of the wafer. In addition, since the purge gas flows outward from the wafer S without interrupting the flow of the process gas uniformly flowing toward the wafer, uniform film formation can be performed with respect to the wafer. Since no W film is deposited on the lower surface of the wafer, production of particles on the lower surface of the wafer can be suppressed to prevent contamination to the wafer.

The film forming apparatus according to this embodiment is not limited to the above apparatus, and it may have arrangements, e.g., shown in FIGS. 12 and 13. In an apparatus shown in FIG. 12, a table 34 is arranged in place of the support frame 31 in the apparatus shown in FIG. 3, and a wafer is mounted on the table 34. In an apparatus shown in FIG. 13, the ring member 32 arranged on the surface of the wafer in the apparatus shown in FIG. 12 is replaced by a ring member 33 tightly contacting not only the surface of the wafer but also the peripheral end surface thereof and the surface region of the wafer table 34 surrounding the wafer. A communication hole 33a is formed in the ring member 33 to communicate with the flow path formed between the table 34 and the exhaust chamber 41. The purge gas supplied to the lower surface side of the wafer can flow outward from the peripheral edge portion of the wafer through the communication hole 33a.

In each of the apparatuses having the arrangements shown in FIGS. 12 and 13, since the purge gas supplied from the lower surface side of the wafer flows outward from the peripheral edge portion of the wafer, the same effect can be obtained as in the apparatus shown in FIG. 3. Note that, in each of the apparatuses shown in FIGS. 12 and 13, e.g., a resistance heater 53 is provided in the table 34, and the wafer S can be heated by the resistance heater 53.

Note that the ring member in this embodiment means a member having an annular structure, and the shape of the ring member can be properly selected in accordance with that of a target object. For example, if a target object has a polygonal shape, the ring member becomes an annular member having a polygonal shape. The ring member may be mounted on a target object outside the process chamber, and then loaded into the process chamber.

Another embodiment of the present invention will be described below.

In the film forming apparatus according to the above embodiment, when a film formation process is to be performed with respect to the wafer, a film is formed on the outer surface of the ring member in addition to the surface of the wafer to be processed. A thin film is continuously formed from the outer surface of the ring member to the surface of the wafer to be processed. Upon the film formation process, when the ring member is moved upward by a lifting mechanism to be dismounted from the wafer, the thin film continuously formed from the outer surface of the ring member to the surface of the wafer to be processed is cut off. At this time, the thin film near the cutoff portion may peel off to produce particles.

Such a drawback of the above embodiment is improved in an apparatus according to this embodiment.

Figure 14:
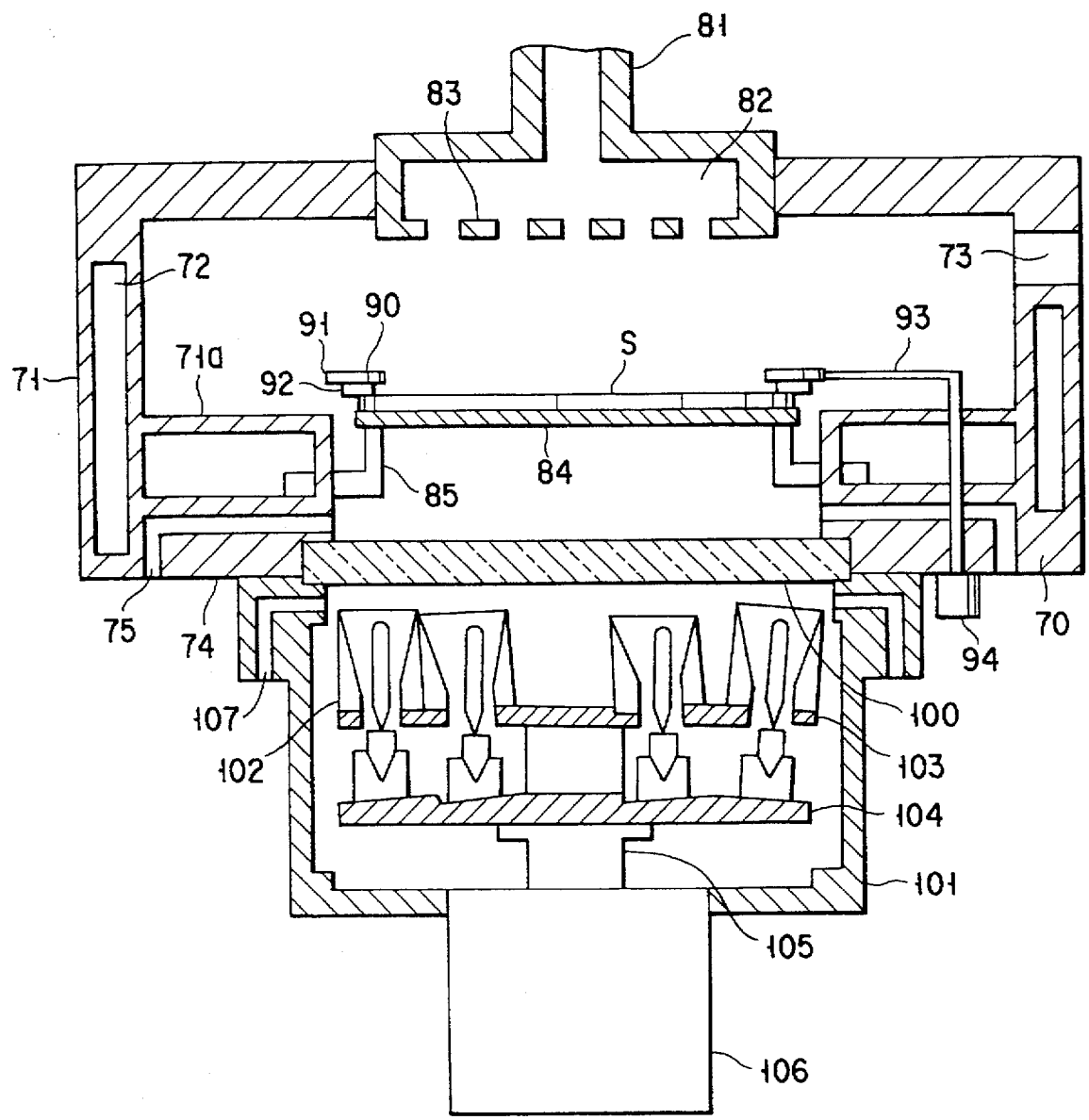
FIG. 14 is a sectional view showing a thermal CVD film forming apparatus according to another embodiment of the present invention.

FIG. 14 is a sectional view showing a thermal CVD film forming apparatus according to this embodiment. A process chamber 70 is for performing film formation with respect to a semiconductor wafer S as a target object therein, and is air-tightly sealed. A process gas supply pipe 81 for supplying a process gas containing, e.g., a $WF_6$ gas as a film forming gas, and an $N_2$ gas and an $H_2$ gas as carrier gases is coupled to the top portion of the process chamber 70. A gas introducing chamber 82 is formed on the lower end portion of the process gas supply pipe 81. A gas diffusion plate 83 for supplying a process gas into the process chamber 70, e.g., in a showerlike manner is provided to the lower surface of the gas introducing chamber 82.

A table 84 for supporting the semiconductor wafer S is horizontally provided under the gas introducing chamber 82 in the process chamber 70. The table 84 is fixed to a table support frame 85 extending from a projection 71a (to be described later) of a side wall 71. A ring member 90 for covering the peripheral edge portion of the surface (a surface on which a thin film is to be formed) of the semiconductor wafer S mounted on the table 84 is provided to freely contact the surface of the semiconductor wafer S, e.g., to vertically move between a position to cover the surface of the wafer and a position above it. The vertical movement of the ring member 90 is achieved by a drive mechanism 94 coupled to the ring member 90 through a support member 93.

A part of the side wall 71 of the process chamber 70 forms the projection 71a projecting inside the process chamber 70 so as to surround the table 84 and the lower region thereof. The wafer is mounted on the table 84, and a gap between the upper end portion of the inner peripheral edge portion of the projection 71a of the side wall 71 and the ring member 90 forms a flow path of a purge gas (to be described later).

A circulation path 72 of cooling water for cooling the process chamber 70 is formed in the side wall 71, and an exhaust port 73, connected to a vacuum pump (not shown), for keeping the interior of the process chamber 70 at a predetermined pressure is also formed in the side wall 71. Purge gas supply paths 75 for supplying a purge gas consisting of, e.g., an $N_2$ gas toward the lower surface side of the wafer, e.g., in a direction of the table 84 are formed in a bottom wall 74 of the process chamber 70 and the projection 71a of the side wall 71.

A quartz transmission window 100 is mounted on the bottom portion of the process chamber 70, and a heating chamber 101 is arranged under the transmission window 100. A plurality of heating lamps 102 constituting a heating means for heating the semiconductor wafer S are fixed at predetermined positions on a pair of upper and lower rotary plates 103 and 104 in the heating chamber 101. The rotary plates 103 and 104 are connected to a rotation mechanism 106 through a rotating shaft 105.

Cooling air feed ports 107 for feeding cooling air is provided to the side portions of the heating chamber 101 in order to prevent the interior of the process chamber 70 and the transmission window 100 from being overheated.

Figure 15:
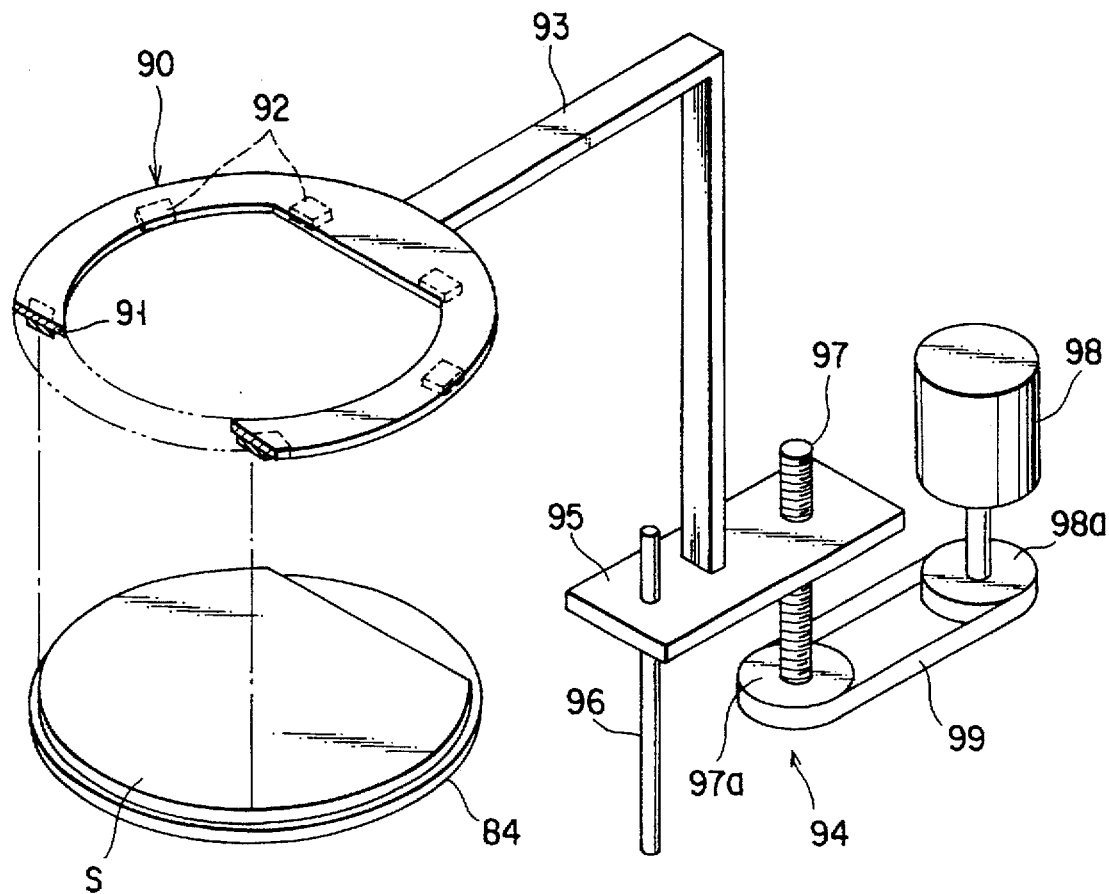
FIG. 15 is a perspective view showing a ring member and a drive mechanism of the apparatus in FIG. 14.
Figure 16:
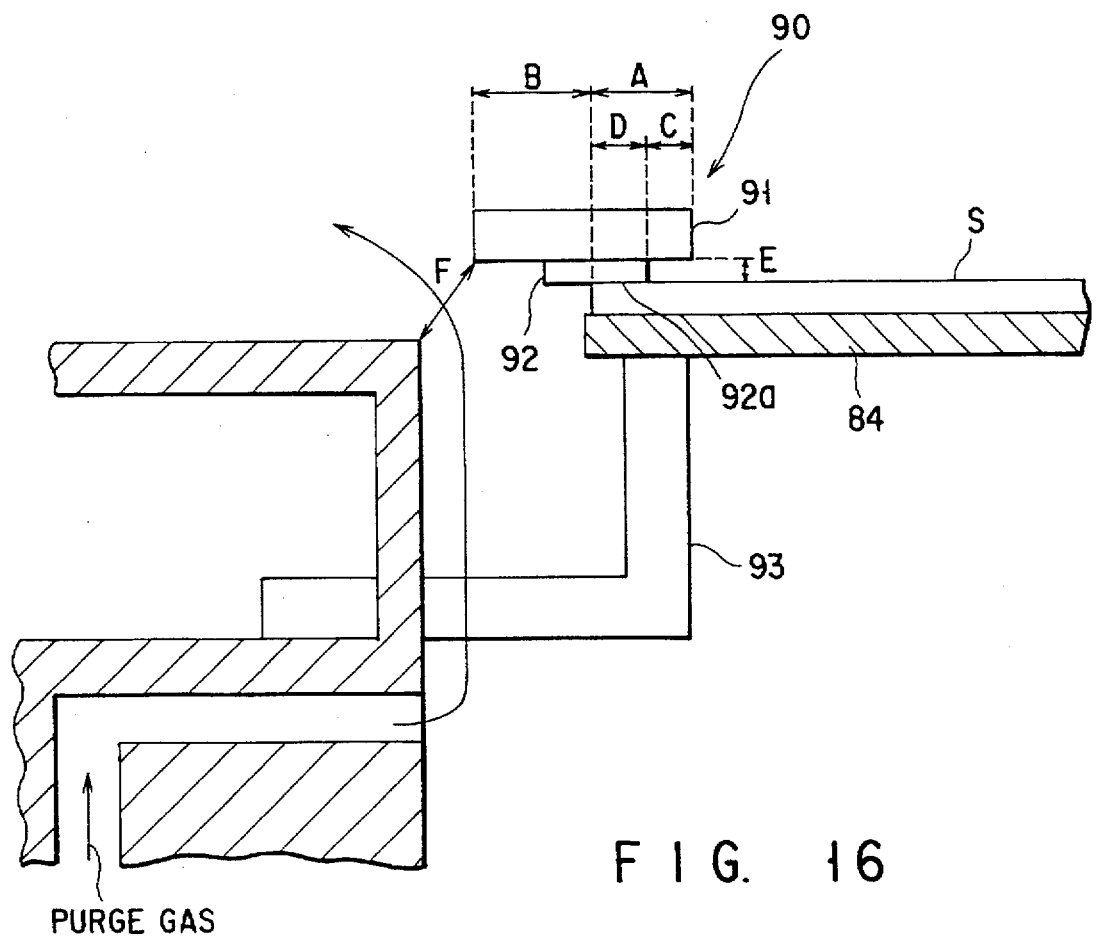
FIG. 16 is an enlarged sectional view showing the main part of the apparatus in FIG. 14.

As shown in FIGS. 15 and 16, the ring member 90 is constituted by an annular press ring portion 91 formed to cover the entire peripheral edge portion of the wafer, and contact portions 92 provided at, e.g., six positions on the lower surface of the press ring portion 91 with intervals in a circumferential direction. When the press ring portion 91 is to cover the peripheral edge portion of the surface of the wafer, the outer peripheral edge portion of the press ring portion 91 projects outside the wafer, and the inner peripheral edge portion thereof does not cover a portion of the wafer to which film formation process is performed such that an overlapping portion A with the wafer, and a projection B are respectively set at, e.g., about 4 to 6 mm and about 20 to 30 mm.

The lower surfaces of the contact portions 92 serve as press surfaces 92a which press the peripheral edge portion of the wafer, and gap is uniformly formed between the lower surface of the press ring portion 91 and the surface of the wafer by the contact portions 92.

If the gap is too wide (i.e., each contact portion 92 is too high), the process gas enters in the deep portion of the gap in a film formation process with respect to the wafer to continuously form a film between the contact portions 92 and the surface of the wafer S. In addition, the purge gas goes around the surface of the wafer. In contrast to this, if each gap is too narrow, a film formed at the inner end surface side of the press ring portion 91 and a film formed at the wafer side continue without being cut off. Therefore, the height of each contact portion 92 must be determined in consideration of both the conditions.

If the contact portions 92 are brought too close to the inside, a film is deposited on the inner end surfaces of the contact portions 92 and continuous with a film at the wafer side. If the inner end surfaces of the contact portions 92 are brought too close to the outside, a press area becomes smaller to decrease a press force with respect to the wafer. Therefore, it is important that the respective sizes of the contact portions 92 must be set in consideration of these points. In this embodiment, a distance C from the press ring portion 91 to the inner peripheral edge portion of each contact portion 92 is set at, e.g., 2 to 4 mm; a width D of a contact portion between the peripheral edge portion of the wafer and each press surface 93, e.g., 2 mm; and a height E of each contact portion 92, e.g., 10 μm to 200 μm. A distance F between the lower end portion of the outer peripheral edge portion of the press ring portion 91 and the projection 71a is set at, e.g., 0.5 to 3 mm.

As shown in FIG. 15, the drive mechanism 94 is constituted as follow. A ball screw 97 threadably engaged with a support plate 95 is driven by a motor 98 through a transmission belt 99 wound around pulleys 97a and 98a, and the ring member 90 is vertically moved by this along a guide rod 96 with a precision of 0.1 mm unit.

The operation of the apparatus having the above arrangement will be described below.

First, the semiconductor wafer S, having the same structure as in FIG. 4, as a target object is mounted on the table 84 by a convey arm (not shown) through a loading/unloading port (not shown). The ring member 90 is moved downward to press the peripheral edge portion of the surface of the wafer S by the drive mechanism 94. The heating lamps 102 are turned on to heat the wafer to, e.g., 350° to 500° C. The process gas consisting of, e.g., a $WF_6$ gas and a carrier gas is supplied to the process chamber 2 through the process gas supply pipe 81, the gas feed chamber 82, and the gas diffusion plate 83 at a flow rate of, e.g., 10 to 200 SCCM while the process chamber 70 is evacuated by the vacuum pump (not shown) through the exhaust port 73 to keep the interior of the process chamber 70 at a predetermined pressure of, e.g., 50 Torr. The $WF_6$ gas is decomposed by the heat of the wafer, W (tungsten) is produced, and the W film is deposited on the surface of the wafer S.

Figure 17:
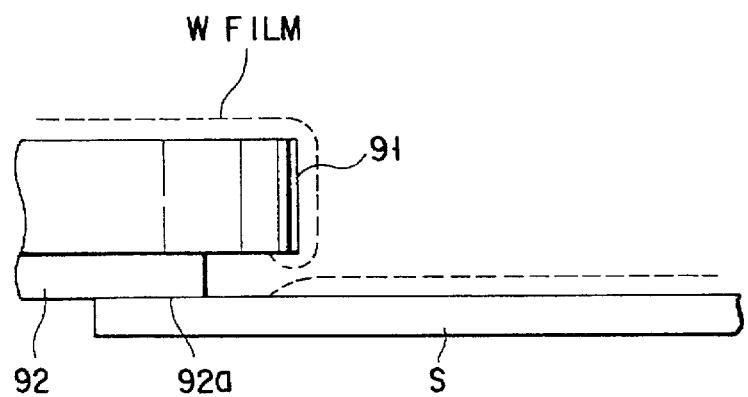
FIG. 17 is a schematic view showing a state of film formation by the apparatus according to this embodiment.

At this time, the W film is formed on the surface, the inner peripheral edge portion, and the lower surface of the inner peripheral edge portion of the press ring portion 91 of the ring member 90 in addition to the surface of the semiconductor wafer S. Since the gaps are formed between the lower surface of the press ring portion 91 and the surface of the wafer by the contact portions 92, the W film is divided into that at the wafer side and that at the press ring portion 91 side as shown in FIG. 17. Therefore, continuity of the film at these portions can be prevented, and the W film is not formed in the gaps as described above.

The purge gas is supplied from the purge gas supply paths 75 toward the lower surface side of the wafer to the ring member 90 at a flow rate of, e.g., 100 cc/min to 2000 cc/min, and almost all the purge gas flows outward from the peripheral edge portion of the wafer through the flow path between the ring member 90 on the semiconductor wafer S and the projection 71a of the side wall 71 as represented by an arrow in FIG. 16. For this reason, the process gas is prevented from going around the peripheral edge portion and the lower surface of the wafer. As a result, the W film is prevented from being deposited on the peripheral edge portion and the lower surface of the wafer. In addition, since the purge gas flows outward from the wafer without interrupting the flow of the process gas flowing toward the wafer, uniform film formation can be performed with respect to the surface of the wafer. Note that since each gap between the lower surface of the inner peripheral edge portion of the ring member 90 and the surface of the wafer is formed at about 10 μm to 20 μm, the purge gas does not go around the surface of the wafer through the gap.

After the film formation process with respect to the wafer is performed in this manner, the ring member 90 is moved above the wafer by the lifting mechanism 94 to be dismounted from the peripheral edge portion of the wafer, and is unloaded outside the process chamber 70 by the convey arm (not shown) through the load/unload port (not shown).

In this embodiment, the purge gas supplied from the lower surface side of the wafer is communicated outward from the peripheral edge portion of the wafer by covering the peripheral edge portion of the wafer using the ring member 90. With this arrangement, the process gas is prevented from going around the peripheral edge portion of the wafer. As a result, the W film is prevented from being deposited on the peripheral edge portion and the lower surface of the wafer. In addition, since the purge gas flows outward from the wafer without interrupting the flow of the process gas uniformly flowing toward the wafer, uniform film formation can be performed with respect to the wafer.

Since the gaps are formed between the lower surface of the inner peripheral edge portion of the ring member 90 and the surface of the wafer at predetermined intervals, the W film is not continuously formed from the ring member 90 to the surface of the wafer, but is divided into the respective portions. When the ring member 90 is to be dismounted from the semiconductor wafer S, the W film is not cut off. Therefore, production of particles caused by peeling the W film is suppressed to prevent contamination to the wafer.

Still another embodiment of the present invention will be described below.

This embodiment, different from the above two embodiments, is applied to a film forming method of forming a buried layer in a target object, and intends that both the burying characteristics of the buried layer and the surface roughness thereof are satisfied.

Figure 18:
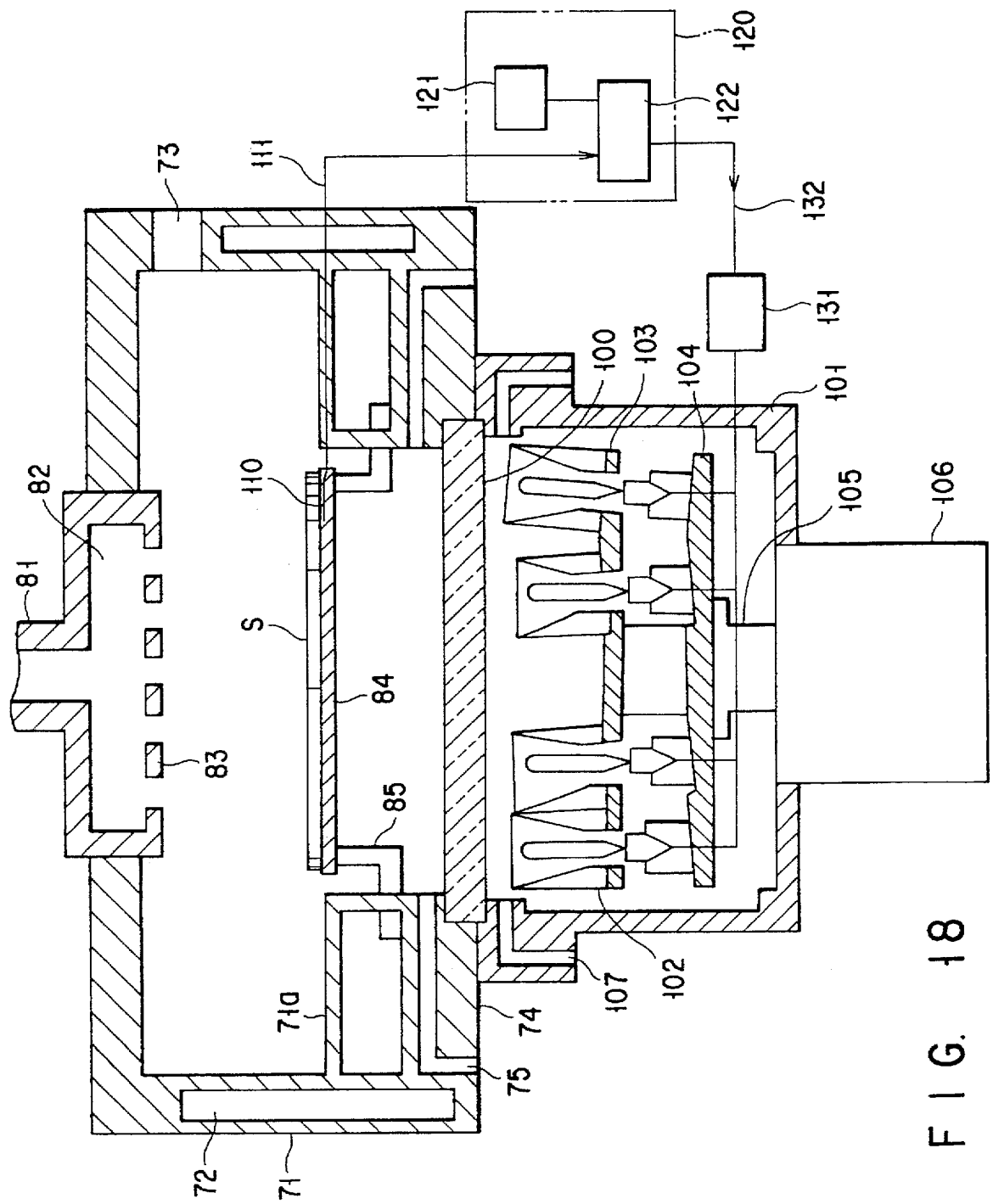
FIG. 18 is a sectional view showing a thermal CVD apparatus for performing still another embodiment of the present invention.

FIG. 18 is a view showing an example of a thermal CVD film forming apparatus for performing the method of this embodiment. This apparatus basically has the same arrangement as that in FIG. 14 except that a temperature control mechanism of heating lamps 102, which is omitted in FIG. 14, is drawn, and a ring member 90 is not provided. Therefore, the same reference numerals as in FIG. 14 denote the same parts, and a description thereof will be omitted. Note that the ring member 90 need not be provided in order to obtain an effect intended in this embodiment. However, it is preferable to provide the ring member 90 because the above effects are also added.

In this embodiment, a table 84 has a small heat capacity. The small heat capacity of the table 84 means not only that a material itself has a small heat capacity, but also that a final heat capacity becomes small in consideration of a thickness or the like. More specifically, a material having a high heat absorption efficiency, e.g., a carbon-based material such as amorphous carbon, a carbon graphite, and composite carbon, or an overall opaque material obtained by performing film formation, in advance, on a non-black material such as SiC can be suitably used for the table 84. The plate thickness of the table 84 is preferably about 0.5 to 3 mm, and its diameter is preferably substantially equal the diameter of a wafer 10 (i.e., the area of its mounting surface has substantially equal to the area for mounting a wafer), and is set at, e.g., −10 mm (size by which the table 84 is positioned inward from the peripheral edge of the wafer by 10 mm) to +20 mm (size by which the table 84 is positioned outward from the peripheral edge of the wafer by 20 mm) using the diameter of the wafer S as standard.

A thermocouple 110 as a temperature detection means is provided on the upper surface of the table 84, and, e.g., the temperature of the peripheral edge portion of the lower surface of a wafer S is detected by the thermocouple 110. A signal cable 132 drawn out from a power supply 131 of the heating lamps 102 is connected to a controller 120 having a temperature setter 121, a power controller 122, and the like. The controller 120 receives a temperature detection signal from the thermocouple 110 through a signal cable 111, and the power controller 122 controls the irradiation amount of the heating lamps 102 on the basis of the temperature detection signal and a set signal of the temperature setter 121 having a predetermined temperature setting program and the like.

An example according to the method of this embodiment using the apparatus having this arrangement will be described.

Figure 19A:
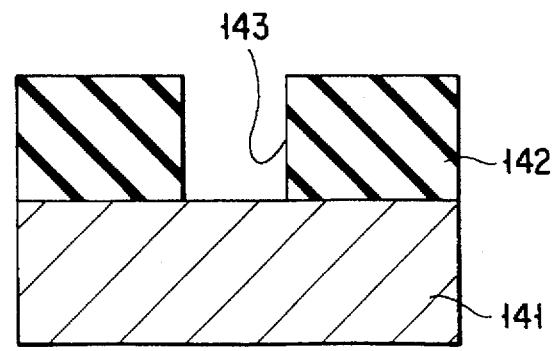
FIGS. 19A to 19C are views for explaining steps of a method according to this embodiment.

For example, as shown in FIG. 19A, the semiconductor wafer S as a target object is constituted such that a silicon oxide film 142 and a hole 143 as a to-be-buried portion such as a contact hole or a through hole are formed on and in the surface of a polysilicon film 141. First, the wafer S is mounted on the table 84 by a convey means (not shown). The table 84 is heated by the heating lamps 102 to heat the wafer S on the table 84. Exhaustion is performed by a vacuum pump (not shown) through an exhaust port 73.

Figure 20:
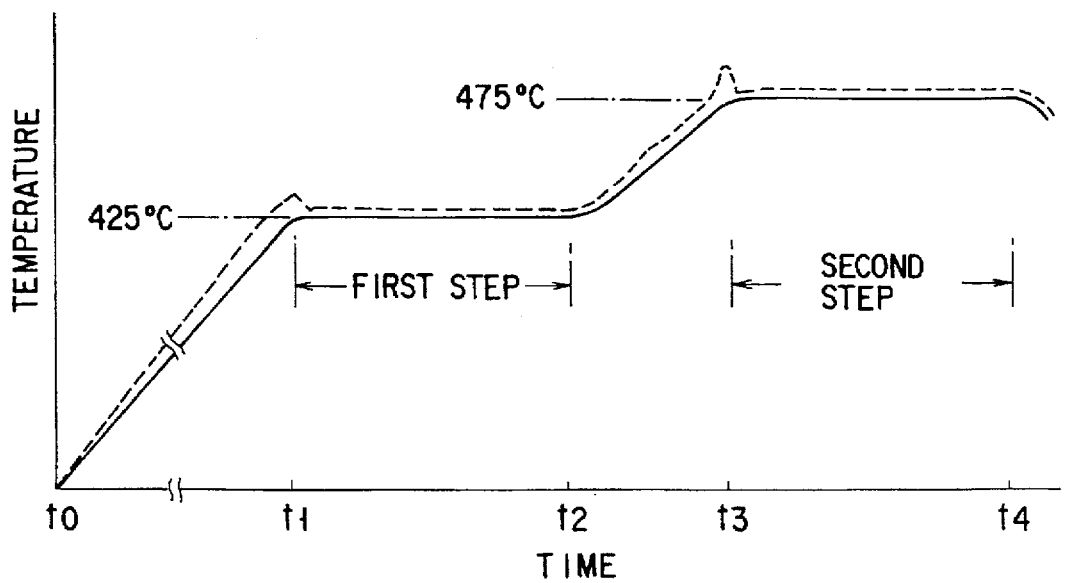
FIG. 20 is a graph showing an example of changes in temperatures of a semiconductor wafer and a wafer table when this embodiment is performed.

FIG. 20 is a graph wherein the ordinate and the abscissa represent a temperature and time, respectively. A dotted line (1) represents a change in temperature of the wafer table 84, and a solid line (2) represents a change in temperature of the wafer S. In this graph, $t_0$ indicates time when the wafer S is mounted on the wafer table 84, and $t_1$ indicates time when a process gas is started to be supplied.

An example will be described with the graph corresponding to processes. When the heating lamps 102 are turned on at time $t_0$, the semiconductor wafer S is indirectly heated through the table 84, and the temperature of the wafer S abruptly increases. After the temperature of the wafer S is, e.g., 425° C. (at time $t_1$), a $WF_2$ gas, an $H_2$ gas, an $A_r$ gas, and an $N_2$ gas are supplied respectively at flow rates of 80 SCCM, 750 SCCM, 900 SCCM, and 100 SCCM into a process chamber 70 from a gas supply source (not shown) through a process gas supply pipe 81 while keeping this temperature. The process chamber 70 is evacuated by the vacuum pump (not shown) through the exhaust port 73 to keep the interior of the process chamber 70 at a predetermined pressure of, e.g., 50 Torr. The $WF_6$ gas is decomposed by the heat of the wafer S, W (tungsten) is produced, and the W film is formed on the surface of the wafer S.

This film forming step is performed for, e.g., 50 seconds. Then (after time $t_2$), supply of the process gas is stopped, and the power of the heating lamps 102 is adjusted to increase its irradiation amount, thereby increasing the temperature of the wafer 10 to, e.g., 475° C. for 60 seconds. Thereafter (after time $t_3$), the supply of the process gas is started to perform film formation. At this time, e.g., the flow rates of the $A_r$ gas and the $N_2$ gas are set at the same values as in the previous process, and those of the $WF_6$ gas and the $H_2$ gas are set at 40 SCCM (half the flow rate in the previous process), and 1,500 SCCM (twice the flow rate in the previous process), respectively. After this film forming step is performed for, e.g., 50 seconds, supply of the process gas is stopped at time $t_4$.

In this example, the film forming step wherein the wafer S is set at 425° C. is the first step, and the film forming step wherein the wafer S is set at 475° C. is the second step. The temperatures of 425° C. and 475° C. are the first and second temperatures, respectively.

Figure 19B:
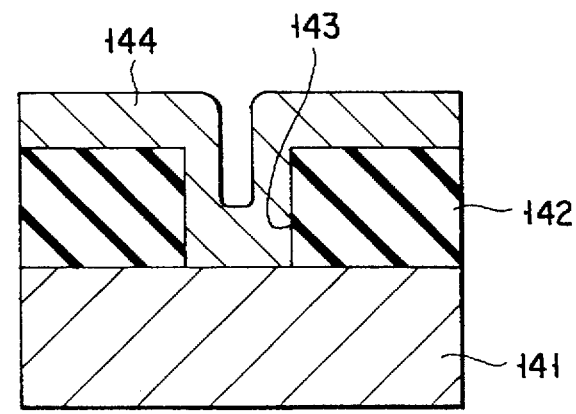
Figure 19C:
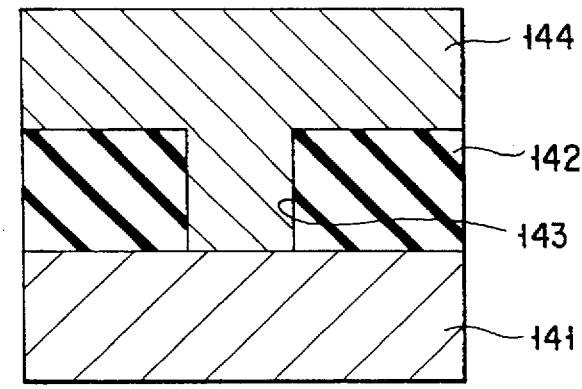

In the first step, for example as shown in FIG. 19B, a W film 144 is buried in the hole 143. Subsequently, in the second step, for example, as shown in FIG. 19C, the W film 144 is formed over the hole 143.

These sequential temperature control operations are performed by incorporating the temperature setting program in the temperature setter 121 so as to make the temperature pattern of the wafer 10 with respect to a time become a pattern as shown in FIG. 20. The temperature of the wafer table 84 is set at the first temperature, e.g., 425° C. before the wafer S is mounted thereon.

Figure 21:
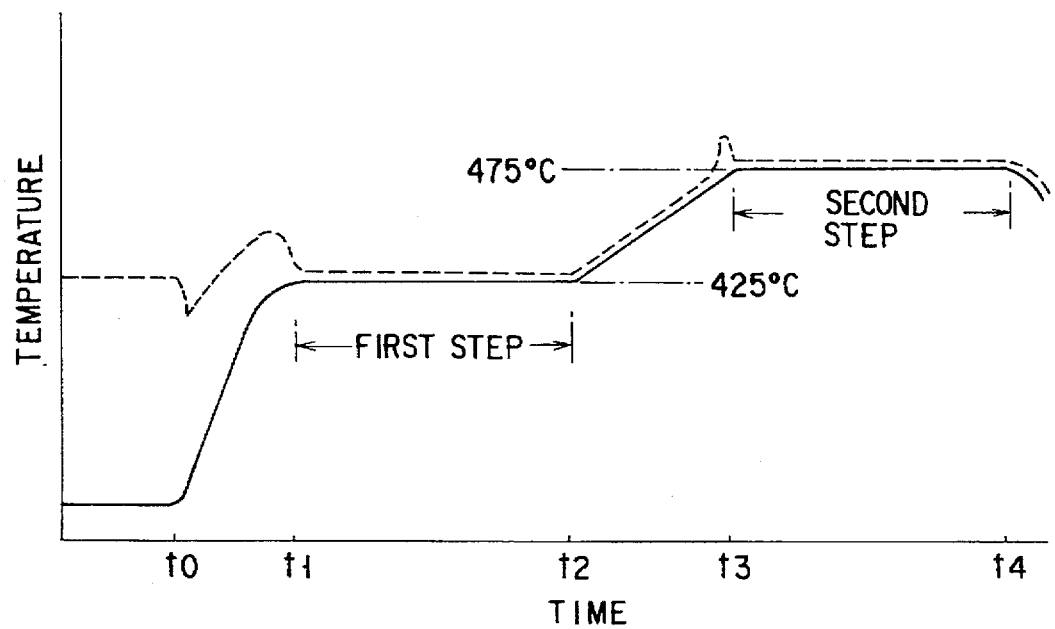
FIG. 21 is a graph showing another example of changes in temperatures of a semiconductor wafer and a wafer table when this embodiment is performed.

FIG. 21 is a view showing the temperature (dotted line (1)) of the wafer table 84 in this case and that (solid line (2)) of the table 84.

According to the above example, the film formation step is divided into two steps. In the first step, the wafer S is heated to a temperature suitable for burying the hole 143, e.g., 425° C. to perform film formation. In the second step, the wafer S is heated to a temperature suitable for improving a morphology, e.g., 475° C. to perform film formation. With these procedures, good burying, i.e., uniform burying with suppressing formation of voids can be performed. In addition, the surface of the formed W film 144 becomes smooth, and the surface of the W film 144 obtained by following etching back also becomes smooth by transfer. For this reason, if the line width of a pattern becomes micropatterned, obstacles in, e.g., a lithographic step by a stepper can be reduced.

Since the heating lamps 102 are used as heating sources, a heating rate is high when the temperature of the wafer S is increased from that in the first step to that in the second step. In contrast to this, when a resistance heater is provided in the thick wafer table to heat the wafer, it requires several tens minutes to increase the temperature of the wafer S to the above temperature because a change in temperature by the resistance heater is slow. Therefore, it is actually difficult to apply this to a mass-production line.

In the case wherein the wafer S is directly heated by the heating lamps 102, since a reflectance changes in accordance with a condition of the lower surface of the wafer 10, it is difficult to constantly heat the wafer 10 to a predetermined temperature. In the above embodiment, however, since the wafer 10 is indirectly heated through the wafer table 84, the wafer 10 is constantly heated to a predetermined temperature without being influenced by a condition of the lower surface of the wafer S. Therefore, a stable film forming process can be realized.

In the above embodiment, the first step may be shifted to the second step at a timing when a part of the hole is buried, or when the entire hole is buried. The temperatures of the wafer in the first and second steps are not limited to the above example. In a case of burying W using $WF_6$, however, they are set within preferable ranges of, e.g., 350° C. to 450° C. and 400° C. to 500° C., respectively.

An intermediate step using a process temperature between these process temperatures may be interposed between the first and second steps. Each of temperatures in the first and second steps may not always be constant.

A buried portion which is buried according to this embodiment includes another linear recessed portion or a hole locally arranged, e.g., in an island-like shape in addition to a contact hole and a through hole. Further, this method is not limited to be applied to burying of W. Still further, a target object is not limited to a semiconductor wafer, but it may be a glass substrate in a process of manufacturing a liquid crystal substrate.

What is claimed is:

1. A film forming apparatus comprising:

a chamber for housing a target object having a surface on which a film is to be formed, and performing a film formation process with respect to said target object;

process gas supply means for supplying a process gas for forming said film onto said surface of said target object on which said film is to be formed;

film forming means for performing film formation using the film forming gas with respect to said surface of said target object on which said film is to be formed;

purge gas supply means for supplying a purge gas from a side opposite to said surface of said target object on which said film is to be formed toward a peripheral edge portion of said target object; and a ring member positioned at a position to cover a peripheral edge portion of said surface on which said film is to be formed when film formation is to be performed with respect to said target object, said ring member having an outer edge projecting from an outer edge of said target object in the film formation, and wherein a gap is provided between said ring member and said target object, wherein said ring member defines a flow path which extends past said outer edge of said ring member in which at least substantially all the purge gas flows outward from said target object without passing through said gap, and wherein said gap has a width such that said film formed on said target object is not continuous with a film formed on said ring member, whereby said ring member functions to define said flow path which extends past said outer edge of said ring member for at least substantially all the purge gas for improved uniformity of said film formed on said surface of said target object and said gap functions to provide a discontinuity between the film formed on the target object and the film formed on said ring member.

2. A film forming apparatus according to claim 1, wherein the film forming means comprises a heater for heating said target object, so that said heater decomposes the process gas to form said film on said target object.

3. A film forming apparatus according to claim 1, further comprising moving means for causing said ring member to move between a process position near said target object and a retreat position apart from said target object.

4. A film forming apparatus according to claim 1, wherein the gap between said ring-shaped member and said target object is formed by interposing a plurality of spacers.

5. A film forming apparatus as recited in claim 1, further including means for supporting said target object at an underside of said target object, said means for supporting allowing purge gas to pass therethrough such that said purge gas passes through the support means and then along said flow path past said outer edge of said ring member.

6. A film forming apparatus as recited in claim 5, wherein said means for supporting supports said target object such that a lower surface of the target object is exposed to the purge gas.

7. A film forming apparatus comprising:
   a chamber having an upper area for processing and a lower area for heating:
   means for supplying a process gas in the upper area;
   an annular member provided in the chamber to define the lower area therein;
   a plurality of support arms extending from the annular member to the lower area and circumferentially spaced from each other to define a purge gas flow path between adjacent support arms, the support arms having extended end portions for supporting a target object having an upper surface on which a film is to be formed by the process gas, so that the object is positioned between the upper and lower areas and a first annular purge gas flow path is defined between the target object and annular member;
   a ring member provided in the upper area to cover a peripheral edge portion of said upper surface of the target object, the ring member having an outer edge horizontally projecting from an outer edge of the target object in the film formation, and defining a second annular purge gas flow path between the outer edge of said ring member and the annular member;
   means for supplying a purge gas into the lower area, so that the purge gas flows to the upper area through the purge gas flow path and the first and second annular purge gas flow paths; and
   means for heating the target object supported by the supporting means and the purge gas in the lower area;
   wherein said ring member includes means for forming a gap between the lower surface thereof and the upper surface of the target object, the gap having a width such that the film formed on the upper surface of the target object is not continuous with a film formed on the ring member and such that the purge gas does not flow through the gap.

8. A film forming apparatus according to claim 7, wherein said annular member has an upper wall, an annular exhaust chamber positioned below the upper wall, and a plurality of exhaust holes formed in the upper wall, so that the purge gas flowing in the upper area flows along the upper wall of the annular member and is exhausted into the exhaust chamber through the exhaust holes.

9. A film forming apparatus according to claim 7, wherein said means for forming a gap includes a plurality of contact portions extending from the lower surface of the ring member at spaced intervals in a circumferential direction about said ring member, each of the contact portions having a lower surface which contacts the peripheral portion of the upper surface of the target object during a film formation process.

10. A film forming apparatus according to claim 7, wherein said support arms support the target object so that the lower surface of the object is exposed to the lower area, wherein the lower surface of the target object is directly exposed to the purge gas and is heated by the heating means.

* * * * *